United States Patent [19]

Bates et al.

[11] Patent Number: 5,631,672
[45] Date of Patent: May 20, 1997

[54] SELF-TIMED REAL-TIME DATA TRANSFER IN VIDEO-RAM

[75] Inventors: Matthew D. Bates, Austin, Tex.; Roderick M. P. West, Colchester, Vt.

[73] Assignee: International Business Machines Corporation, Armonk, N.Y.

[21] Appl. No.: 499,557

[22] Filed: Jul. 7, 1995

Related U.S. Application Data

[63] Continuation of Ser. No. 175,874, Dec. 30, 1993, abandoned.

[51] Int. Cl.⁶ .................................................. G09G 5/00
[52] U.S. Cl. ......................... 345/200; 345/189; 345/190
[58] Field of Search ............................... 345/196, 197, 345/200, 189, 190

[56] References Cited

U.S. PATENT DOCUMENTS

| | | | |
|---|---|---|---|
| 4,855,959 | 8/1989 | Kobayashi | 365/239 |
| 4,884,069 | 11/1989 | Farand | 345/190 |
| 4,924,415 | 5/1990 | Winser | 345/190 |
| 5,097,256 | 3/1992 | Eldridge et al. | 345/191 |
| 5,121,360 | 6/1992 | West et al. | 365/230.03 |
| 5,179,372 | 1/1993 | West et al. | 345/200 |
| 5,201,037 | 4/1993 | Kohiyama et al. | 345/164 |

FOREIGN PATENT DOCUMENTS 3-34187  2/1991  Japan .............................. G11C 11/401

OTHER PUBLICATIONS

EPO Search Report for App. No. EP 94 30 9759 completed 29 Sep. 1995 with English language abstract for ref. AL attached.

*Primary Examiner*—Kee M. Tung
*Assistant Examiner*—Matthew Luu
*Attorney, Agent, or Firm*—Martin McKinley; Andrew J. Dillon

[57] ABSTRACT

A Video-RAM semiconductor memory device comprised of a RAM array having an address input for inputting row, column, and target addresses, and a serial access array having a serial output port. The Video-RAM has address/control logic which detects a stimulus such as a RAS clock from an external controller indicating a coarse timing location for a data transfer between the RAM array and the serial access array. The control logic then provides control signals, that are internally synchronized with a serial clock, and that occur during a period that a tap pointer is equal to a value one less than a programmable target value or an input target address. This causes a row in the RAM array corresponding to an input row address to be transferred between the RAM array and the serial access array.

28 Claims, 5 Drawing Sheets

SELF-TIMED REAL-TIME DATA TRANSFER IN VIDEO-RAM

This is a continuation of application Ser. No. 08/175,874 filed on Dec. 30, 1993, now abandoned.

BACKGROUND OF THE INVENTION

1. Technical Field

The present invention relates in general to display memory subsystems, graphics and display adapter systems and subsystems, and in particular to semiconductor memory devices. Still more particularly, the present invention relates to Video-RAMs and other similar memory devices.

2. Description of the Related Art

A Video-RAM (VRAM) is a 2 port RAM (Random Access Memory), which is essentially a conventional DRAM with the addition of a second port where memory data can be accessed serially. A VRAM comprises a RAM array, a Serial Access Memory (SAM) array, address/control logic, and transfer gates. The RAM array is connected to the primary (RAM) port of the VRAM and behaves in a manner identical to that of a DRAM or SRAM. The SAM array, sometimes called the Shift Register, is connected to the secondary (SAM or Serial) Port of the VRAM and may be accessed serially under the control of an external asynchronous clock, the Serial Clock. The address/control logic supervises the address multiplexing on the RAM port and provides all the control and global timing function of the VRAM. The transfer gates allow memory data to pass between the RAM array and the SAM array, under the control of the address/control logic.

The benefit of a VRAM is that the two ports can be operated independently and asynchronously, except when data must be transferred between the RAM and SAM arrays. The SAM array usually has the memory capacity of one row of the RAM array, and a full row of memory data is transferred between the RAM and the SAM in a single data transfer access. The independent and asynchronous operation of the two ports finds excellent application in display memory subsystems, where the RAM port is used to update the contents of display memory, and the SAM port provides display data to be rastered onto a display such as a CRT. The RAM port would generally operated at the frequency of the update hardware (e.g., a graphics processor). The SAM port would generally be operated at a frequency dictated by the requirements of the display. Because the display data to be rastered onto the display is obtained from the SAM port, almost all the RAM port bandwidth is available for update of the contents of display memory.

In a display memory subsystem, a VRAM supplies display data at the SAM port. Since the SAM array has only the capacity of a single row of display data, it must be continually reloaded with new rows of display data during the time of a display frame. In general, each new row of display data is obtained from a row whose address is one greater than that of the previous row. The reloading of the SAM army with new rows of display data from the RAM array is achieved by performing data transfer cycles at the RAM port. The transfer of data between the RAM array and the SAM array is the only interruption to normal DRAM access cycles at the RAM port. These data transfers may be separated into two distinct types:

1. when the SAM port is inactive, with the Serial Clock stopped;
2. when the SAM port is active, with the Serial Clock running.

The former is usually associated with the loading of the SAM with display data, for the next horizontal scan-line, during periods of blanking in the display frame and, since the Serial Clock is stopped, the data transfer cycle at the RAM port requires no synchronization with the Serial Clock. The latter is usually associated with periods of active video for the horizontal scan-lines of a display frame and, since the Serial Clock is running, the data transfers cycle at the RAM port requires accurate synchronization with the Serial Clock in order to maintain the required seamless flow of display data at the SAM port. The latter is often referred to as a "Real-Time Data Transfer" in the nomenclature of VRAMs, or as a "Mid-Line Reload" in the nomenclature of VRAM-based display subsystems.

In the design of a display memory subsystem, the control and timing of "Real-Time Data Transfers" represents a major problem. A "Real-Time Data Transfer" is a critically timed real-time access, requiring accurate synchronization between RAM and SAM ports. Such a critically timed real-time access requires potentially complex and high-speed circuitry for the synchronization and control of the access. Because of this, designers of VRAM-based display memory subsystems often choose to sacrifice flexibility or under-utilize display memory in order to avoid "Mid-Line Reloads" in the display data and the associated "Real-Time Data Transfers" for the VRAMs.

The conventional method of avoiding Mid-Line Reloads, used in many VRAM-based display memory subsystems, involves a number of restrictions upon how the contents of display memory are mapped on the video display screen. These restrictions are usually:

A fixed start address for the display data on the first horizontal scan line of the display frame.

An address increment, to generate the start address of each subsequent horizontal scan-line, fixed to be equal to or a binary fraction of the capacity of the SAM arrays of the VRAMs in the display memory subsystem.

A horizontal scan-line length requiring an amount of display data not greater than the capacity of the SAM arrays of the VRAMs in the display memory subsystem.

To avoid "Mid-Line Reloads" and thereby avoid "Real-Time Data Transfers," all these restrictions must be satisfied. For a general purpose graphics adapter or display controller, these restrictions can not be applied.

Another means of avoiding "Real-Time Data Transfers" is found in some modern 1 Mb VRAMs which incorporate the so-called "Split-Register" feature. These VRAMs divide the SAM array into two halves, which can be loaded independently by so-called "Split Register Data Transfers," whereby one half of the SAM is loaded while the other half is active. This feature goes a long way to alleviating the problem, but it does not make full and efficient use of the SAM array capacity and can potentially result in twice as many data transfer accesses as would be required when not using the "Split-Register" feature.

An alternative approach that has been suggested, which allows "Real-Time Data Transfers" while still maintaining the high accuracy required for the critically timed data transfer, is to maintain all timing for the transfer internal to the VRAM, rather than external via a controller. Here, the transfer is easily synchronized with the serial output stream because all transfers are automatically initiated internally by the VRAM, based on parameters pre-programmed into the VRAM and synchronized with the Serial Clock. With this approach, no external control is introduced into the timing, so the highly accurate timing required for a Real-Time Data Transfer is achieved.

However, this approach has several disadvantages. First, the VRAM design is significantly complicated to accommodate for the internally timed transfer, making it incompatible with conventional VRAM. Second, the design is inflexible because the static nature of the parameters makes reordering the serial data output during normal operation difficult. Third, the VRAM would have to provide a busy signal or wait-state to the VRAM memory controller when making an internal data transfer in order to avoid simultaneous accesses at the RAM port. Fourth, handling this busy protocol increases complexity of the video controller circuitry, particularly if multiple VRAM busy signals must be managed. Moreover, this busy handshaking protocol renders any existing video controllers unsuitable for utilization with the VRAM.

By a novel enhancement to a conventional Video Random Access Memory (VRAM) device, the disclosed invention simply and efficiently removes the requirement for potentially complex and high-speed circuitry conventionally associated with Real-Time Data Transfers used in VRAM-based memory subsystems. Furthermore, strict mapping restrictions are not imposed on the system, and efficiency of the SAM is not sacrificed. Still further, the VRAM circuit design is not overly complicated, is extremely flexible and dynamic, and does not introduce a wait-state handshaking protocol, making the design completely compatible with existing video controllers, and a natural extension of conventional VRAM data transfers.

SUMMARY OF THE INVENTION

According to the present invention, a Video-RAM semiconductor memory device comprised of a RAM array having an address input for inputting row, column, and target addresses, and a serial access array having a serial output port. The Video-RAM has address/control logic which detects a stimulus such as a RAS clock from an external controller indicating a coarse timing location for a data transfer between the RAM array and the serial access array. The control logic then provides control signals, that are internally synchronized with a serial clock, and that occur during a period that a tap pointer is equal to a value one less than a programmable target value or an input target address. This causes a row in the RAM array corresponding to an input row address to be transferred between the RAM array and the serial access array.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
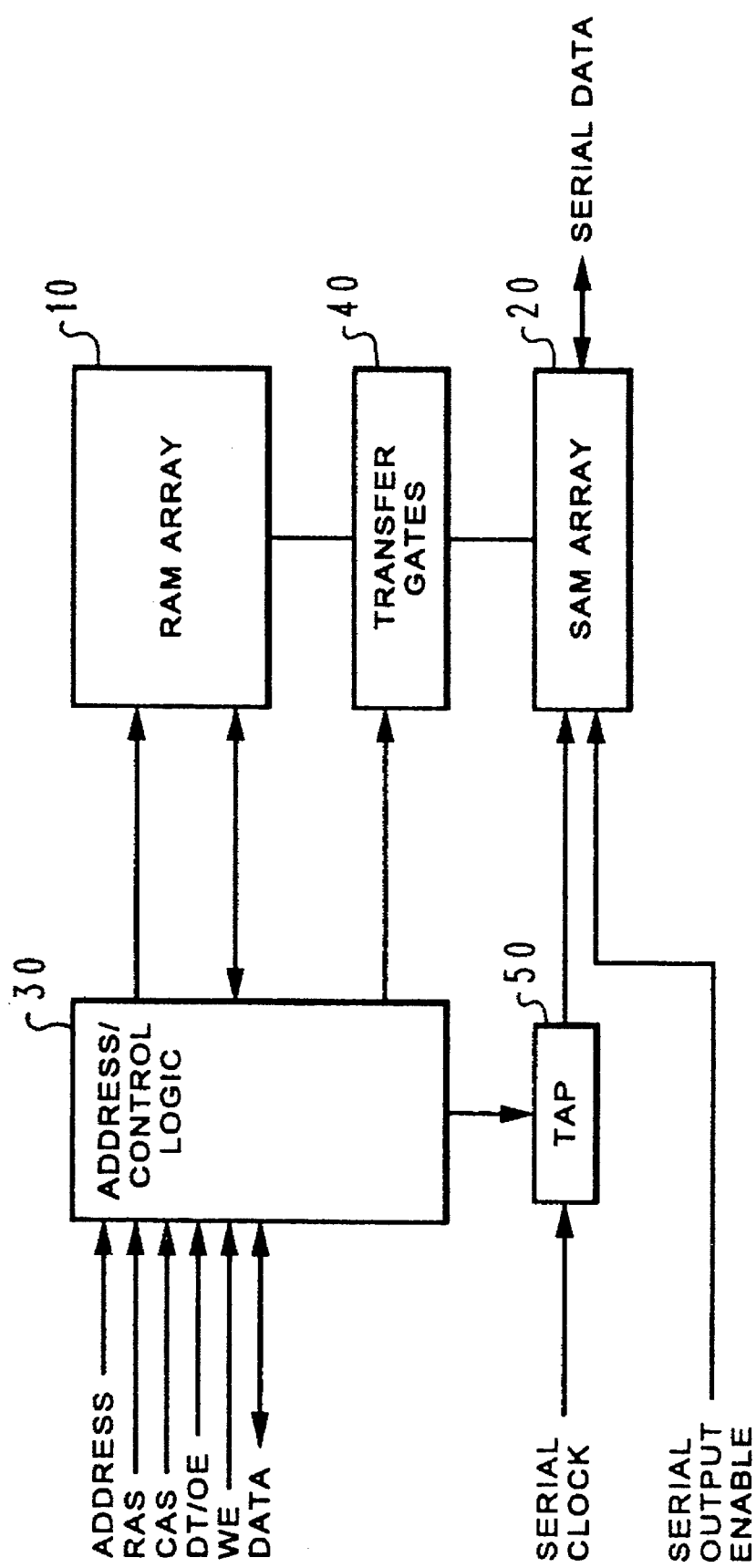
FIG. 1 depicts a block diagram of a VRAM in accordance with a preferred embodiment of the present invention.

With reference now to the figures and in particular with reference to FIG. 1, there is depicted a block diagram of a VRAM in accordance with a preferred embodiment of the present invention. The VRAM comprises a RAM array 10, a SAM array 20, address/control logic 30, transfer gates 40, and Tap Pointer (TAP) 50. The RAM array 10 is connected to the primary (RAM) port of the VRAM and behaves in a manner identical to that of a DRAM or SRAM, under the control of the address/control logic 30. The SAM array 20, sometimes called the Shift Register, is connected to the secondary (SAM or Serial) port of the VRAM and may be accessed serially under the control of an external asynchronous clock, the Serial Clock. The serial access to the SAM 20 is controlled by the Tap Pointer (TAP) 50, which generates an address into the SAM 20 from a counter which increments on each cycle of the Serial Clock. The Tap Pointer (TAP) 50 is loaded with an initial address, under the control of the address/control logic 30, and increments its counter on each cycle of the Serial Clock until it reaches the end of its count, and then wraps back to its first value. The address/control logic 30 supervises the address multiplexing and the data flow on the RAM port and provides all the control and global timing functions of the VRAM. The transfer gates 40 allow memory data to pass between the RAM army 10 and the SAM army 20, under the control of the address/control logic 30.

Figure 2:
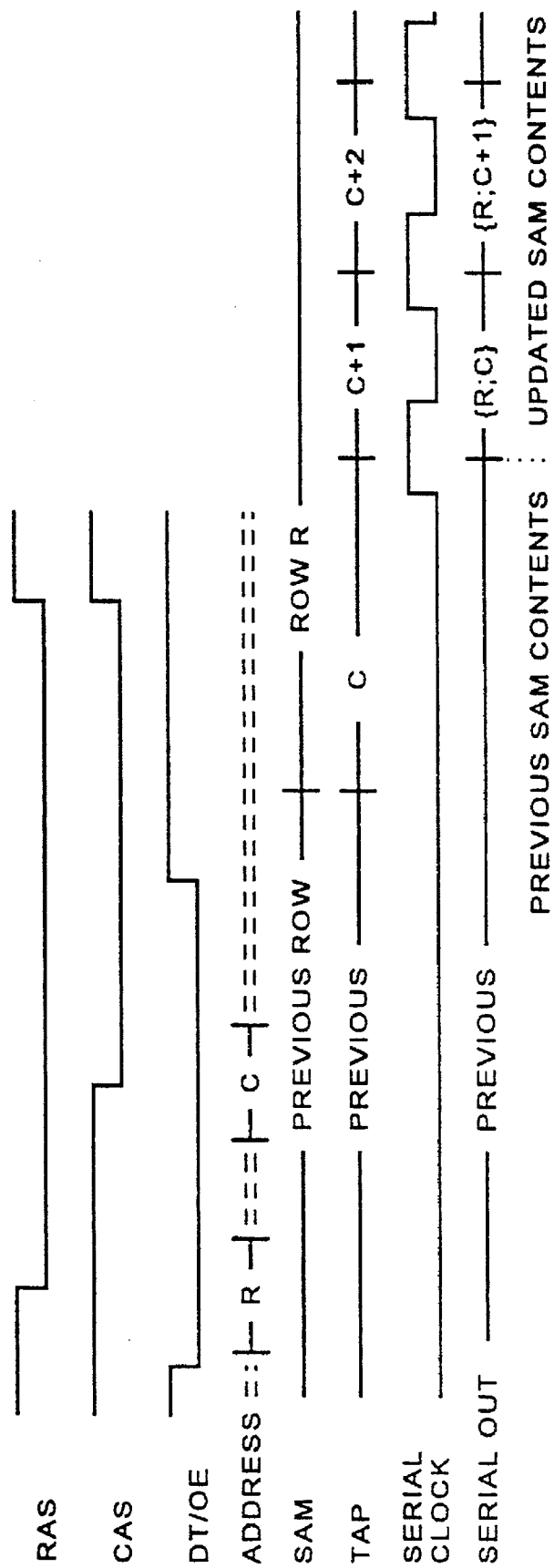
FIG. 2 shows the timing diagram for a conventional Read Data Transfer Cycle with the Serial Clock inactive.

Referring now to FIG. 2, there is shown a timing diagram for a conventional Read Data Transfer Cycle with the Serial Clock inactive. In conventional VRAMs, a Read Data Transfer cycle is indicated by Data Transfer/Output Enable (DT/OE) set to a low level at the falling edge of Row Address Strobe (RAS). At the falling edge of RAS, the row address (R) is obtained from the address input and row R is activated. At the falling edge of Column Address Strobe (CAS), the column address (C) is obtained from the address input. Subsequently, the actual RAM->SAM data transfer occurs at the rising edge of DT/OE. At the data transfer, SAM 20 is loaded is loaded with the contents of row R in RAM array 10, and the Tap Pointer (TAP) 50 is loaded with the column address C. On the first rising edge of the Serial Clock after the actual data transfer, the new contents of the SAM 20 are available at the SAM port, starting at the SAM location given by the Tap Pointer value at the time of the first Serial Clock rising edge. The first item of serial data is the data from row R at column address C (A simplified notation for this data item is {R;C}; this notation will be used to simplify all data references throughout this description). Each subsequent rising edge of the Serial Clock causes the Tap Pointer 50 to increment and present the contents of the SAM 20 serially at the SAM port: {R;C} is followed by {R;C+1}, {R;C+2}and so on.

Figure 3:
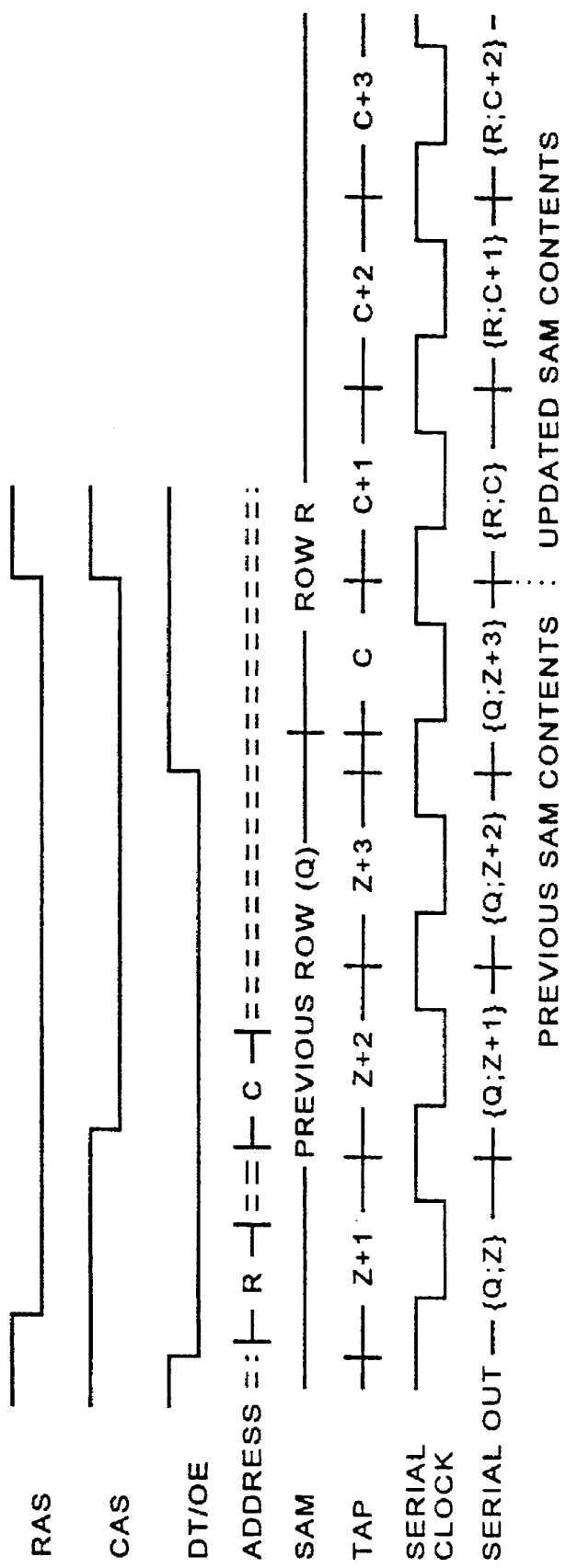
FIG. 3 shows the timing diagram for a conventional Read Data Transfer Cycle with the Serial Clock active, the so-called "Real-Time Data Transfer".

FIG. 3 shows the timing diagram for a conventional Read Data Transfer Cycle with the Serial Clock active, the so-called "Real-Time Data Transfer." As shown in FIG. 3, if the Read Data Transfer is performed with the Serial Clock running, then to maintain the correct sequence of data at the SAM port, the data transfer, signalled by the rising edge of DT/OE, must be accurately timed to occur during the correct Serial Clock cycle. Current VRAMs have a Serial Clock cycle time of 15 ns minimum and typically require that the rising edge of DT/OE occur no earlier than 5 ns after the previous Serial Clock rising edge and no later than 5 ns before the next Serial Clock rising edge. This means that the transfer must be timed into a "window" that can be as narrow as 5 ns, which requires extremely high-speed circuitry. It is probable that future VRAMs may have even faster Serial Clocks and the "window" could be correspondingly narrower.

The present invention of a self-timed real-time data transfer VRAM is capable of accurately timing the real-time data transfer within a very narrow timing "window" without the need for high speed external control circuitry. This VRAM produces such high accuracy through an internally timed data transfer that easily and efficiently synchronizes the critically timed real-time access, rather than requiring an external controller to provide the transfer timing.

Figure 4:
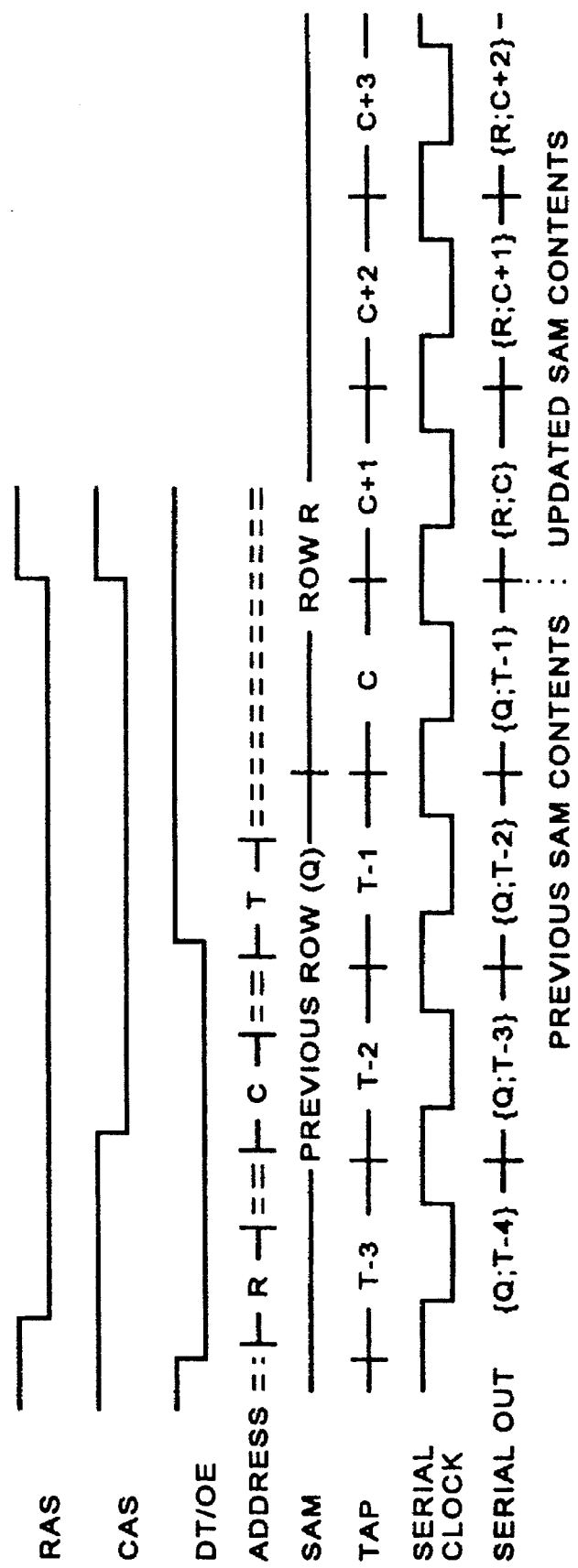
FIG. 4 depicts a timing diagram for the Self Timed Data Transfer (STDT) Real-Time Read Data Transfer cycle in the general case with three parameters in accordance with a preferred embodiment of the present invention.

Referring now to FIG. 4, there is depicted a timing diagram for the Self Timed Data Transfer (STDT) Real-Time Read Data Transfer cycle in the general case with three parameters as described in a preferred embodiment of the present invention. It illustrates an advantageous means of control of the STDT function. As will be apparent to those skilled in the art, other advantageous means of control can be devised, with relative timings, sequences, polarities and operative functions of the control inputs varied. The actual operation of STDT accesses will depend on a number of factors, including whether the STDT feature is offered as an alternative to or in addition to conventional real-time data transfer accesses.

In the most general case of the STDT function, three parameters are required. The required parameters are:

R—row address

C—cell address

T—target of STDT

The three required parameters can be reduced to two by restricting the "STDT target" (T) to be always equal to the column address (C). Here, the general case of the STDT function with three parameters will be discussed, and below, the two parameter case (C=T) will be discussed as an example of the useful variant of STDT. The details and application of other such variants and simplifications of the STDT function may be readily discerned by those skilled in the art.

At the falling edge of RAS, the row address (R) is obtained from the address input and row R is activated. Moreover, at the falling edge of RAS, the low level of DT/OE indicates that the access is a Read Data Transfer (as is conventional with VRAMs). At the falling edge of CAS, the column address (C) is obtained from the address input. At the rising edge of DT/OE, the target address is obtained from the address input, and the STDT target is set equal to the target address. As such, the STDT target is an internal target value that is programmed by the input of the target address. When the Tap Pointer has reached a value equal to one less than the STDT target (TAP=T–1) and is about to be incremented to the STDT target (T), the data transfer takes place in response to the rising edge of the Serial Clock. At the data transfer, data is transferred between row R and the SAM, and the Tap Pointer is loaded with the column address (C).

In response to the first rising edge of the Serial Clock after the data transfer, the new contents of the SAM are made available at the Serial Port. The Tap Pointer, in response to the Serial Clock, has followed the sequence T–2, T–1, C, C+1, C+2 through the data transfer. The flow of Serial data, at the SAM port, has stepped seamlessly through the data transfer, following the sequence {Q;T–2}, {Q;T–1}, {R;C}, {R;C+1}, {R;C+2}. It is probable that in most cases, this sequence would be continuous in memory address space with Q=R–1 and C=T=0. However, this three parameter case of the STDT function provides extremely advantageous flexibility and utility of application.

As can be seen, the clock stimuli from the external controller of the video display system, including RAS, CAS, and DT/OE, indicate the timing of the data transfer with coarse granularity. Once the VRAM has received this stimulus, the data transfer is internally synchronized with the Serial Clock as the Tap Pointer reaches a value one less than the target address. Thus, the VRAM of the present invention is able to make a high precision self-timed data transfer at the fine timing granularity necessary to transfer during an extremely narrow timing "window", and to seamlessly transfer serial data from the serial port in real-time.

Figure 5:
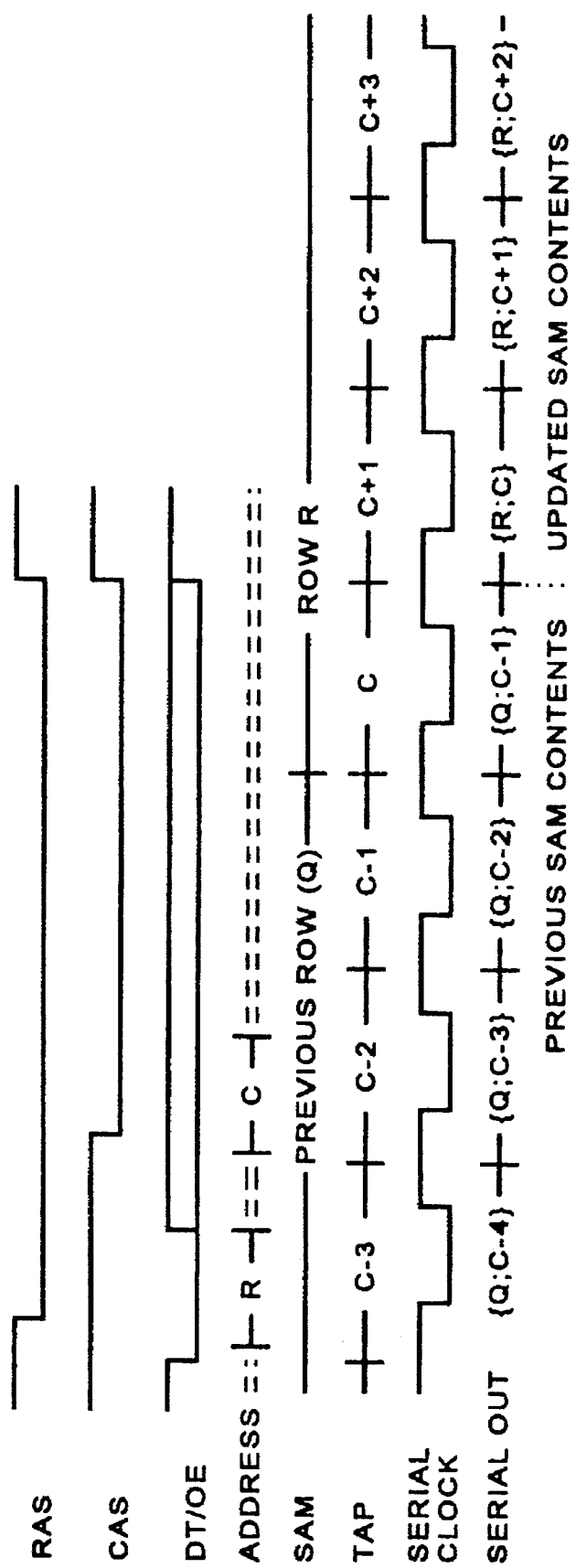
FIG. 5 shows a timing diagram for the STDT Real-Time Read Data Transfer cycle in the two parameter case in accordance with a preferred embodiment of the present invention.

FIG. 5 shows a timing diagram for the STDT Real-Time Read Data Transfer cycle in the two parameter case (C=T) of a preferred embodiment of the present invention. The figure illustrates an advantageous means of control of such a variant of the STDT function. As before, other advantageous means of control can be devised, with relative timings, sequences, polarities and operative functions of the control inputs varied. The two parameter case (C=T) has a certain synergy with conventional Read Data Transfers in that only the row address and column address need be supplied, and the timing of the rising edge of DT/OE can remain the same since it is essentially irrelevant in this variant of STDT.

At the falling edge of RAS, the row address (R) is obtained from the address input and row R is activated. Moreover, at the falling edge of RAS, the low level of DT/OE indicates that the access is a Read Data Transfer (as is conventional with VRAMs). This is the only function of and timing requirement on DT/OE in the C=T variant of STDT. Therefore, the timing of the rising edge of DT/OE is irrelevant, as shown in FIG. 5. At the falling edge of CAS, the column address (C) is obtained from the address input. In this two parameter variant, the column address (C) is also the STDT target (C=T). When the Tap Pointer has reached a value equal to one less than the STDT target (TAP=C–1) and is about to be incremented to the STDT target (C), the data transfer takes place in response to the rising edge of the Serial Clock. At the data transfer, data is transferred between row R and the SAM. At the data transfer, the Tap Pointer may be loaded with the column address (C), however this is unnecessary since the Tap Pointer would be incremented to that value by the Serial Clock.

In response to the first rising edge of the Serial Clock after the data transfer, the new contents of the SAM are available at the Serial Port. The Tap Pointer, in response to the Serial Clock, has followed the sequence C–2, C–2, C, C+1, C+2 through the data transfer. The flow of Serial data, at the SAM Port, has stepped seamlessly through the data transfer, following the sequence {Q;C–2}, {Q;C–1}, {R;C}, {R;C+1}, {R;C+3}. It is probable that in most cases, this sequence would be continuous in memory address space with Q=R–1 and C=T=0.

An alternative to the two parameter case occurs when only the row address and target address are input. The column address is assumed to be zero (C=0) or some other preselected value programmed into the VRAM, and the STDT Target (T) is set equal to the target address. When the Tap Pointer reaches a value equal to one less than the STDT target (TAP=T−1) and is about to be incremented to the STDT target (T), the data transfer takes place in response to the rising edge of the Serial Clock. At the data transfer, data is transferred between row R and the SAM, and the Tap Pointer is loaded with the preselected column address (C).

It is also possible for one or even no parameter variants of STDT to be implemented. In the one parameter case, only the row address R would be supplied, and the column address and STDT Target would be set to some preselected values. For example, the STDT Target could be set to zero (0), and the Column address could be set to twelve (12) for a SAM of bit length 512. When the Tap Pointer has reached a value equal to one less than the STDT Target, and is about to be incremented to the STDT Target, the data transfer takes place in response to the rising edge of the Serial Clock. In the example, when the Tap Pointer reaches the value of its full count (i.e. 511, or binary "111111111" for a 9 bit TAP), and is about to wrap around to zero (0) on the next increment, the data transfer takes place in response to the Serial Clock. At the data transfer, data is transferred between row R of the RAM and the SAM, and the Tap Pointer is loaded with the column address (C), for example twelve (12).

In the no parameter case, the column address and STDT target would be assumed to be zero (0) or some other preselected value, and the row address of the data to become the new contents of the SAM would be assumed to be one greater than the previous row address used to load the previous contents of the SAM. In this zero parameter case, some means of starting and restarting the row address sequence must be made available. A timing stimulus from the external controller would still be required to provide the coarse timing location of the data transfer. Furthermore, it is possible, if desired, to provide variants of STDT with more than three parameters.

In each of the cases described above, the data transfer has been timed internally by the VRAM device, synchronizing the data transfer to the Serial Clock stream. Unlike conventional Real-Time Data Transfers, the STDT data transfer has not been timed by external circuitry applying control signals at the RAM port, but rather has been timed by the VRAM device itself. The only timing requirements on the external control signals is that the STDT access has been started and the required STDT parameters have been supplied prior to the data transfer; and that the STDT access is terminated after the data transfer. Meeting these requirements does not require complex or high speed circuitry since the timing granularity can be significantly coarser than that required for synchronization into the high speed Serial Clock stream.

The size of additions/modifications to a conventional VRAM design required to implement the present invention would add insignificantly to the total size of a VRAM. The implementation of STDT in a VRAM design only requires minor additions/modifications to VRAM address/control logic to detect and control the STDT function. Also, the addition of a comparator attached to the TAP counter circuitry would be needed; the number of bits of the comparator being the same as the number of bits of the TAP counter (9 bits for a SAM of length 512). One, any or all the possible variants of the STDT function can be offered as an alternative to or in addition to conventional data transfer accesses available in current VRAMs. Moreover, although the invention has been discussed primarily in relation to Read Data Transfers (RAM->SAM), as used in a display memory subsystem, it also finds application in relation to Write Data Transfers (SAM->RAM) found in some current VRAMs.

While the invention has been particularly shown and described with reference to a preferred embodiment, it will be understood by those skilled in the art that various changes in form and detail may be made therein without departing from the spirit and scope of the invention.

What is claimed is:

1. A method of self-timed real-time data transfer within a Video-RAM memory device having a RAM, a serial access memory and a tap pointer, the method comprising the steps of:

performing a data transfer, internally synchronized with a serial clock, from a row in the RAM to the serial access memory during a period that the tap pointer value is equal to a programmable target value, wherein the data transfer is internally timed by the Video-RAM memory device such that external timing signals from an external controller are not required;

reading a row address present at an address input; and reading a column address present at an address input, wherein the programmable target value is set to a value one less than the column address.

2. A method of self-timed real-timed data transfer within a Video-RAM semiconductor memory device according to claim 1, wherein the column address is zero.

3. A Video-RAM memory device that performs a self-timed real-time data transfer, comprising:

a RAM array;

a serial access array having a serial output port;

an address input for inputting addresses;

sensing means for detecting a stimulus from an external controller indicating a selected coarse timing interval for a data transfer between the RAM array and the serial access array;

a tap pointer for counting the pixels output from the serial output port;

control logic for providing control signals that are synchronized with a serial clock and that occur during the coarse timing interval at a point that the tap pointer is equal to a programmable target value, wherein the control logic outputs one or more control signals, in response to the sensing means detecting the stimulus, commanding a data transfer between the RAM array and the serial access array to occur during the selected coarse timing interval, but wherein the data transfer is exactly timed internally by the control signals and not the stimulus; and transfer gates for transferring data between the RAM and the serial access array in response to control signals provided by the control logic.

4. A Video-RAM semiconductor memory device according to claim 3, wherein the stimulus is a state transition of a data transfer signal.

5. A Video-RAM semiconductor memory device according to claim 3, wherein the data transferred is that contained in a RAM row having a row address one greater than the previous serial access memory contents.

6. A Video-RAM semiconductor memory device according to claim 3, wherein the data transferred is that contained in a RAM row corresponding to a row address read at the address input.

7. A Video-RAM semiconductor memory device according to claim 3, wherein the stimulus is a state transition of a RAS at a time where a data transfer signal is in an enabling state.

8. A Video-RAM semiconductor memory device according to claim 3, wherein the programmable target value is set to a preselected value.

9. A Video-RAM semicondutor memory device according to claim 3, wherein the programmable target value is set to a value one less than a column address read at the address input.

10. A Video-RAM semiconductor memory device according to claim 9, wherein the column address is zero.

11. A Video-RAM semiconductor memory device according to claim 9, wherein the column address is read in response t a change in state of a first input signal.

12. A Video-RAM semiconductor memory device according to claim 11, wherein the first input signal is CAS.

13. A Video-RAM semiconductor memory device according to claim 9, further wherein the control logic loads the tap pointer with the column address at the same time that control signals are output commanding the data transfer.

14. A Video-RAM semiconductor memory device according to claim 6, wherein the programmable target value is set to a value one less than a target address read at the address input.

15. A Video-RAM semiconductor memory device according to claim 14, wherein the target address is equal to zero.

16. A Video-RAM semiconductor memory device according to claim 14, wherein the target address is read in response to a change in state of a first input signal.

17. A Video-RAM semiconductor memory device according to claim 16, wherein the first input signal is a data transfer signal.

18. A Video-RAM semiconductor memory device according to claim 14, wherein a column address is read at the address input.

19. A Video-RAM semiconductor memory device according to claim 18, further wherein the control logic loads the tap pointer with the column address at the same time that control signals are output commanding the data transfer.

20. A Video-RAM semiconductor memory device according to claim 18, wherein the column address is read in response to a change in state of a first input signal.

21. A Video-RAM semiconductor memory device according to claim 20, wherein the first input signal is CAS.

22. A Video-RAM semiconductor memory device according to claim 6, wherein the row address is read in response to a change in state of a second input signal.

23. A Video-RAM semiconductor memory device according to claim 22, wherein the second input signal is RAS.

24. A Video-RAM semiconductor memory device according to claim 3, wherein the serial port begins to output the serial access array contents in response to the rising edge of the first serial clock cycle occurring after the data transfer.

25. A method of self-timed real-time data transfer within a Video-RAM memory device having a RAM, a serial access memory and a tap pointer, the method comprising the steps of:

performing a data transfer, internally synchronized with a serial clock, from a row in the RAM to the serial access memory during a period that the tap pointer value is equal to a programmable target value, wherein the data transfer is internally timed by the Video-RAM memory device such that external timing signals from an external controller are not required; receiving a stimulus at the Video-RAM memory device from an external controller requesting a data transfer be performed from the RAM to the serial access memory, and wherein the step of performing a data transfer occurs in response to receiving the stimulus, but wherein the real-time data transfer is internally timed by the Video-RAM memory device and not by the stimulus.

26. A method of self-timed real-time data transfer within a Video-RAM device having a RAM, a serial access memory, and a tap pointer, the method comprising the steps of:

transferring an initial row of pixels from the RAM to the serial access memory after receiving an initial external signal from an external controller, wherein the first row of pixels is serially transferred out of the serial access memory in synchronization with a serial clock;

in response to receiving a subsequent external signal from the external controller, internally calculating, within the Video-RAM, a timing interval during which the initial row of pixels will complete its transfer out of the serial access memory;

generating a control signal within the Video-RAM that occurs during the calculated timing interval and that is synchronized with the serial clock; and performing an accurate and synchronized transfer of a subsequent row of pixels from the RAM to the serial access memory in response to the control signal wherein the timing interval is calculated to be when the tap pointer is equal to a programmable target value.

27. A Video-RAM memory device having self-timed real-time data transfer, comprising:

a RAM array;

a serial access array having a serial output port, wherein a row of pixels loaded into the serial access array is serially transferred out of the serial access array in synchronization with a serial clock;

an address input for inputting addresses;

sensing means for detecting an external signal from an external controller;

timing means for internally calculating a timing interval when a loaded row of pixels will complete its transfer out of the serial access memory, wherein the calculation is made in response to detecting an external signal;

control logic for generating a control signal within the Video-RAM that occurs during the calculated timing interval and is synchronized with the serial clock; and transfer gates for accurately loading a row of pixels from the RAM to the serial access array in synchronization with the control signal wherein the timing means comprises a tap pointer and calculates a timing interval to be when the tap pointer is equal to a programmable target value.

28. A Video-RAM memory device having self-timed real-timed data transfer according to claim 27, wherein the control logic loads the tap pointer with a column address when the control signal is generated.

* * * * *